(12) United States Patent
Alcorn et al.

(10) Patent No.: US 11,294,442 B2
(45) Date of Patent: Apr. 5, 2022

(54) DELAY OF POWER OFF TO WRITE DATA FROM VOLATILE TO NON-VOLATILE MEMORY OF A SOLID STATE DRIVE

(71) Applicant: HEWLETT-PACKARD DEVELOPMENT COMPANY, L.P., Spring, TX (US)

(72) Inventors: Byron A. Alcorn, Fort Collins, CO (US); Shane Ward, Fort Collins, CO (US); Ronald G. Rogers, Fort Collins, CO (US); Lance Ceili, Fort Collins, CO (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 238 days.

(21) Appl. No.: 16/482,970

(22) PCT Filed: Feb. 1, 2017

(86) PCT No.: PCT/US2017/015963
§ 371 (c)(1),
(2) Date: Aug. 1, 2019

(87) PCT Pub. No.: WO2018/143970
PCT Pub. Date: Aug. 9, 2018

(65) Prior Publication Data
US 2020/0233474 A1 Jul. 23, 2020

(51) Int. Cl.
*G06F 1/28* (2006.01)
*G06F 3/06* (2006.01)

(52) U.S. Cl.
CPC ............... *G06F 1/28* (2013.01); *G06F 3/068* (2013.01); *G06F 3/0625* (2013.01); *G06F 3/0659* (2013.01)

(58) Field of Classification Search
CPC ..... G06F 1/32; G06F 1/12; G06F 1/28; G06F 9/44
See application file for complete search history.

(56) References Cited

U.S. PATENT DOCUMENTS 6,304,981 B1 * 10/2001 Spears ................. G06F 11/004
714/22
6,336,174 B1 1/2002 Li et al.
(Continued)

FOREIGN PATENT DOCUMENTS

CN 102789431 B 11/2015
EP 0780000 B1 12/1999

OTHER PUBLICATIONS

Enhanced Power-Loss Data Protection in the Intel® Solid-State Drive 320 Series <http://www.intel.com/content/dam/www/public/us/en/documents/technology-briefs/ssd-320-series-power-loss-data-protection-brief.pdf >.

*Primary Examiner* — Keshab R Pandey
(74) *Attorney, Agent, or Firm* — HP Inc. Patent Department

(57) ABSTRACT

In an example, a method, non-transitory machine-readable storage medium, and apparatus is described for preserving data in a solid state drive in the event of an unclean shutdown of the host computing system. A controller of the host computing system detects an unclean shutdown that initiates a power down of the host computing system, In response to the detecting the controller asserts a first signal that signals the solid state drive to write data in a volatile memory of the solid state drive to a non-volatile memory of the solid state drive, The controller then initiates a timer to count down a predefined delay period after the asserting. Upon an expiration of the timer, the controller asserts a (Continued)

second signal that instructs a power supply of the host computing system to power off.

14 Claims, 4 Drawing Sheets

(56) References Cited

U.S. PATENT DOCUMENTS

| | | | | |
|---|---|---|---|---|
| 8,924,785 | B2* | 12/2014 | Meir | G06F 11/3034 |
| | | | | 714/24 |
| 9,042,197 | B2 | 5/2015 | Allison et al. | |
| 9,223,642 | B2 | 12/2015 | Yu et al. | |
| 9,329,954 | B2 | 5/2016 | Blount et al. | |
| 2005/0168796 | A1* | 8/2005 | Williams | H04N 9/3144 |
| | | | | 359/291 |
| 2009/0249087 | A1 | 10/2009 | Wakrat et al. | |
| 2011/0238135 | A1* | 9/2011 | Marnfeldt | A61N 1/378 |
| | | | | 607/59 |
| 2011/0289272 | A1* | 11/2011 | Chu | G06F 11/1441 |
| | | | | 711/114 |
| 2012/0159060 | A1 | 6/2012 | Yu et al. | |
| 2014/0082406 | A1 | 3/2014 | Erez | |
| 2016/0350130 | A1* | 12/2016 | Tabone | G06F 1/3296 |

* cited by examiner

DELAY OF POWER OFF TO WRITE DATA FROM VOLATILE TO NON-VOLATILE MEMORY OF A SOLID STATE DRIVE

BACKGROUND

A solid state drive (SSD) is a storage device that uses integrated circuit (IC) assemblies to store data for a host computing system persistently.

DETAILED DESCRIPTION

Figure 1:
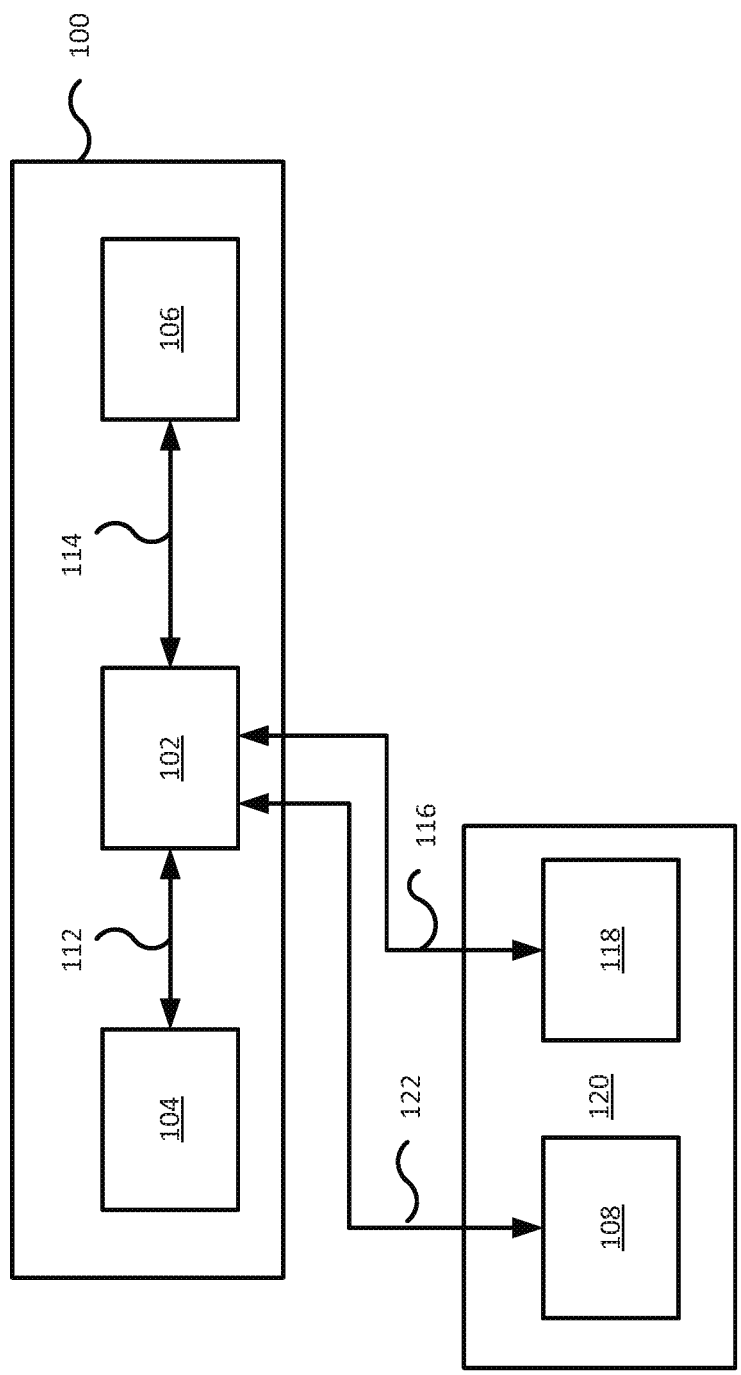
FIG. 1 is a high-level block diagram of an example solid state drive (of the present disclosure.

The present disclosure describes an apparatus, method, and non-transitory computer-readable medium for delaying the power down of a host computing system so that a solid state drive (SSD) of the host computing system has time to write data stored in its volatile memory to its non-volatile memory. An SSD includes a controller and a memory to store the data. The memory may include a volatile memory (e.g., a dynamic random access memory (DRAM)-based volatile memory) to cache or buffer the flow of data coming from the host computing system's main memory and a non-volatile memory (e.g., a negative-AND (NAND)-based flash non-volatile memory) for more persistent storage of user data, metadata, and other data. The controller may write data from the volatile memory to the non-volatile memory, for instance upon power down of the host computing device.

However, the SSD may be susceptible to data loss when the host computing system is shut down in an "unclean" fashion. For instance, many computing systems are programmed to shut down when a user holds the power button for a threshold period of time (e.g., four seconds). However, such a shutdown is considered to be unclean because it does not allow the host computing system's operating system to shut down properly. For instance, it does not include a mechanism for signaling the SSD to inform it that power is being removed from the host computing system. As a result, the SSD may not have an opportunity to write data (e.g., user data, metadata, flash translation tables) that is currently stored in volatile areas such as DRAM cache to non-volatile areas such as flash memory before power is lost. Ultimately, this may lead to data corruption and/or drive failure.

Examples of the present disclosure provide a controller that detects when the host computing system's power button has been held for a threshold period of time (e.g., four seconds, or a minimum amount of time sufficient to initiate power down of the host computing system). In response, the controller initiates a process (e.g., in the operating system) to preserve data (e.g., user data and/or metadata) in the volatile memory of the SSD. The process involves adding a configurable delay between the assertion and/or de-assertion of specific signals (e.g., codes sent over communication channels, specific voltage levels applied to specific lines, or other types of signals) by a controller of the host computing system that are invoked during power down of the host computing system. For instance, a delay may be added by waiting a configurable amount of time between assertion of a reset signal and de-assertion of a power on signal (where de-assertion of the power on signal causes the power supply to remove power from the host computing system including the SSD). Alternatively, the delay may be invoked between the assertion and/or de-assertion of any two signals (including existing signals or new signals that are implemented specifically for this disclosure) that cause a power state transition in a controller of the host computing system, or that indicate an impending power loss to the host computing system and SSD. During this delay, the SSD may move data in its volatile memory (e.g., cache) to non-volatile memory (e.g., NAND-based flash), thereby preventing loss of the data when the host computing system powers down.

FIG. 1 is a high-level block diagram of an example solid state drive (SSD) 100 of the present disclosure. As illustrated, the SSD 100 is connected to a host computing system 120. In one example, the SSD 100 generally includes a controller 102, a volatile memory 104 that is directly accessible by the controller 102, and a non-volatile memory 106 that is also directly accessible by the controller 102.

The controller 102 may comprise an integrated circuit (IC) that integrates various components of a computer or other electronic system, such as a processor, a memory, a timing source, a peripheral, an external interface, and/or other components, onto a single chip substrate.

In one example, the volatile memory 104 comprises a dynamic random access memory (DRAM) cache. The volatile memory 104 is communicatively coupled to the controller 102 via a first data bus 112. The first data bus 112 allows data to be written from the controller 102 to the volatile memory 104, and vice versa.

In one example, the non-volatile memory 106 comprises a high-capacity non-volatile memory, such as an array of NAND-based flash memory banks. The non-volatile memory 106 is communicatively coupled to the controller 102 via a second data bus 114 (e.g., a flash bus). The second data bus 114 allows data to be written from the controller 102 to the non-volatile memory 106, and vice versa.

The controller 102 thus provides, among other functions, an interface between the volatile memory 104 and the non-volatile memory 106 of the SSD 100. As discussed in further detail in connection with FIGS. 2 and 3, the controller 102 may further detect and react to signals from the host computing system 120 that impose a delay during an unclean shutdown of the host computing system 120, for example by writing data from the volatile memory 104 to the non-volatile memory 106.

The controller 102 is further communicatively coupled to components of the host computing system 120. For instance, a high-speed expansion bus 122, such as a peripheral component interface express (PCIe) bus, may connect the controller 102 to a host controller 108 of the host computing system 120. Additionally, a control bus 116 may connect the controller 102 to a micro-controller 118 or other discrete circuitry of the host computing system 120. In one example, the micro-controller 118 is an input/output (I/O) controller, such as a super I/O (SIO) controller, that provides side-band control of the host computing system 120 (including, for example reset signals).

In one example, the host controller 108 is an I/O controller for the SSD 100. To this end, the host controller 108 may comprise a PCIe root port controller, a serial AT attachment (SATA) controller, or a serial attached small computer system interface (SAS) controller. The host controller 108 may be implemented in a computer or hardware processor, as discussed in connection with FIG. 4.

Figure 2:
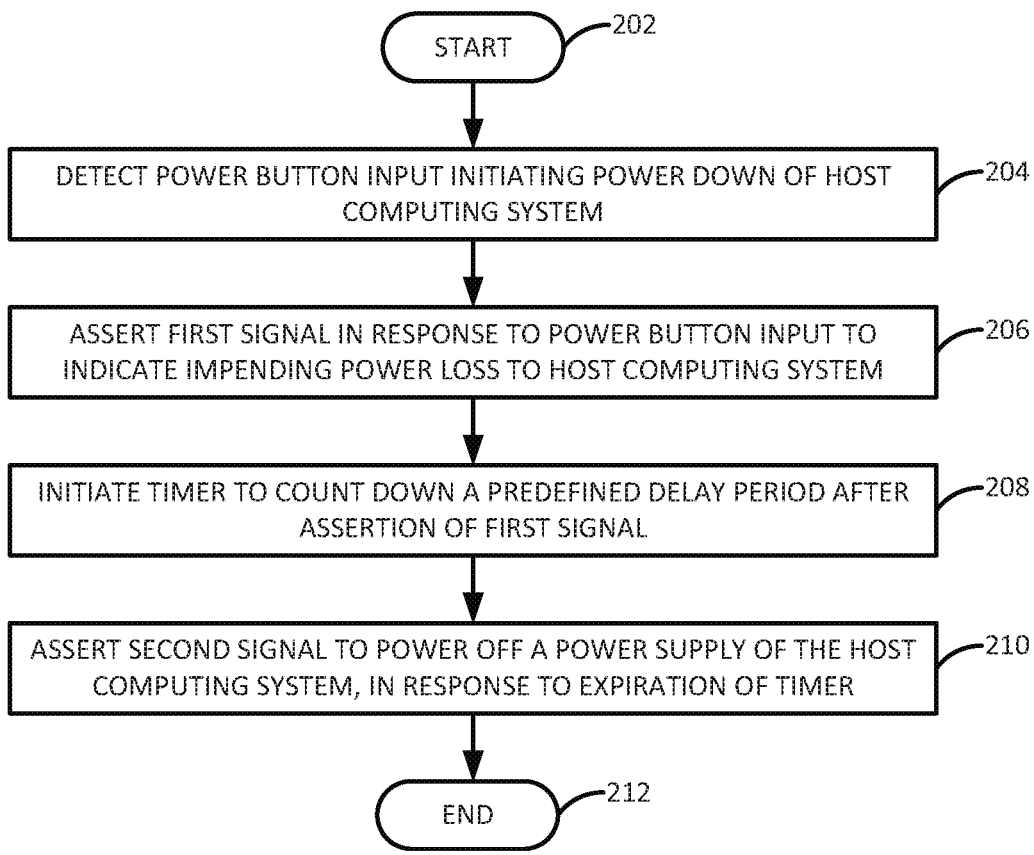
FIG. 2 illustrates a flowchart of an example method for saving data stored in the solid state drive of FIG. 1.

FIG. 2, for instance, illustrates a flowchart of an example method 200 for saving data stored in the solid state drive 100 of FIG. 1. The method 200 may be performed, for example, by the micro-controller 118 of the host computing system 120 illustrated in FIG. 1. It will be appreciated, however, that the method 200 is not limited to implementation with the system illustrated in FIG. 1, and that references to components of FIG. 1 are made for the sake of example.

The method 200 begins in block 202. In block 204, the micro-controller 118 detects an unclean shutdown that initiates a power down of the host computing system. In one example, the unclean shutdown may be indicated by a power button input that initiates a power down of the host computing system 120. For instance, the power button input may comprise a user holding the power button of the host computing system 120 for a threshold period of time that is sufficient to initiate power down (e.g., four seconds). In another example, the threshold period of time could be slightly less than the amount of time sufficient to initiate power down (e.g., two or three seconds, if four seconds initiates power down).

In one example, the micro-controller 118 monitors the power button and tracks the time for which the power button is held. In this case, the micro-controller 118 identifies the expiration of the threshold period of time before a low-power sleep state signal (e.g., an SLP_S3# signal) is asserted by the platform controller hub (PCH) of the host computing system 120.

In another example, rather than directly monitor the timing of the power button hold, the micro-controller 118 monitors a state of the core interruptible (CGL) register of the host computing system 120. During a clean shutdown of the host computing system 120, the basic input/output system (BIOS) is informed and is responsible for resetting the CGL register to zero before assertion of the low-power sleep state signal. However, during an unclean shutdown, the BIOS is uninformed and will not reset the value in the CGL register. Thus, a lack of feedback from the BIOS (e.g., where the lack of feedback is evident in the form of a non-zero value in the CGL register) will signal to the micro-controller 118 that the shutdown is unclean (e.g., that the power button has been held for the threshold period of time). This approach could help to detect other types of "unclean" shutdowns of the host computing system 120 (i.e., in addition to unclean shutdowns that are triggered by holding the power button), In block 206, the micro-controller 118 asserts a first signal in response to the power button input. In one example, the first signal is a signal that indicates that power down of the host computing system 120 is imminent. For instance, the first signal may comprises a reset signal, such as a PCIe reset signal (e.g., a PERST# signal) that originates with the micro-controller 118 and is asserted to the PCIe slots of the high-speed expansion bus 122. In one example, assertion of the first signal also signals the SSD 100 to write data from the volatile memory 104 to the non-volatile memory 106. In another example, the first signal is a dedicated signal meant to signal the SSD 100 to flush the volatile memory 104, rather than a pre-existing signal that is repurposed to serve the dual purpose of indicating host computing system power down and triggering flush of the SSD's volatile memory 104.

In block 208, the micro-controller 118 initiates a timer to count down a predefined delay period (e.g., a predefined period of time) after the assertion of the first signal. In one example, the predefined delay period comprises a period of time that is sufficient to allow the controller 102 of the SSD 100 to write data from the volatile memory 104 to the non-volatile memory 106. In one example, this predefined period of time is configurable (e.g., by the manufacturer of the host computing system 120 or by the end user).

In block 210, the micro-controller 118 either asserts or de-asserts a second signal in response to the expiration of the timer. In one example, the assertion or de-assertion of the second signal causes a power supply of the host computing system 120 to remove power from the host computing system 120.

The method 200 ends in block 212.

Conventionally, the holding of a power button for a period of time sufficient to power down the host computing system would trigger the host computing system's PCH to assert a low-power sleeping state signal (e.g., an SLP_S3# signal). In turn, the assertion of the low-power sleeping state signal would result in the substantially simultaneous assertion of the reset signal and de-assertion of the power on signal. However, by imposing a delay between the assertion of the reset signal and de-assertion of the power on signal, a window of time is created that allows the controller 102 of the SSD 100 to write data from the volatile memory 104 to the non-volatile memory 106 and thereby preserve the data.

In one example, the delay between assertion of the reset signal and de-assertion of the power on signal could be imposed indirectly by the micro-controller 118, by issuing a system management interrupt command (e.g., a SMI# signal) to the basic input/output system (BIOS). In this case, the BIOS determines when and if to impose the delay. As long as the host computing system's state is healthy and the BIOS can respond to the system management interrupt command (e.g., the power button hold is not due to a hung CPU), this alternative can be implemented.

Figure 3:
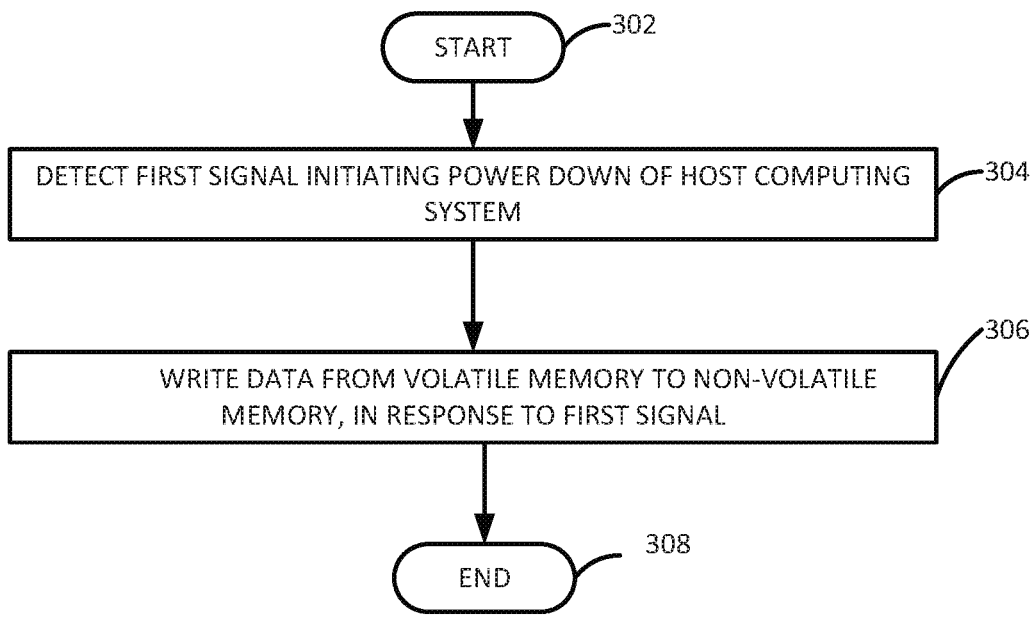
FIG. 3 illustrates a flowchart of another example method for saving data stored in the solid state drive of FIG. 1.

FIG. 3 illustrates a flowchart of another example method 300 for saving data stored in the solid state drive 100 of FIG. 1. The method 300 may be performed, for example, by the controller 102 of the SSD 100 illustrated in FIG. 1. It will be appreciated, however, that the method 300 is not limited to implementation with the system illustrated in FIG. 1, and that references to components of FIG. 1 are made for the sake of example.

The method 300 begins in block 302. In block 304, the SSD controller 102 detects a first signal that initiates a power down of the host computing system 120. In one example, the first signal may comprise an assertion of a reset signal.

In block 306, the SSD controller 102 writes data from the volatile memory 104 to the non-volatile memory 106, in response to the detection of the first signal. In one example, this predefined period of time is configurable.

The method 300 ends in block 308.

Figure 4:
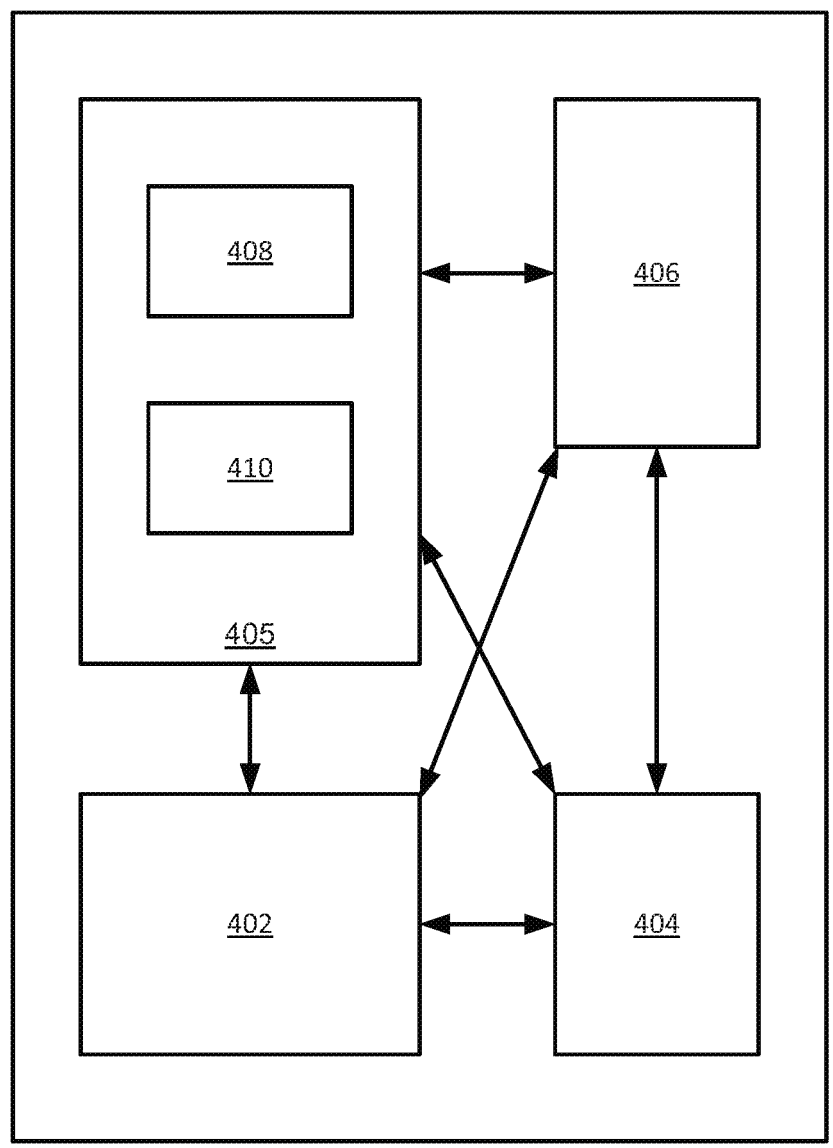
FIG. 4 depicts a high-level block diagram of an example computer that can be transformed into a machine capable of performing the functions described herein.

FIG. 4 depicts a high-level block diagram of an example computer 400 that can be transformed into a machine capable of performing the functions described herein. As a result, the examples of the present disclosure modify the operation and functioning of the general-purpose computer to provide a power down delay for preserving data in a SSD, as disclosed herein.

As depicted in FIG. 4, the computer 400 comprises a hardware processor element 402, e.g., a central processing unit (CPU), a microprocessor, or a multi-core processor, a memory 404, e.g., a temporary memory such as random access memory (RAM) and/or read only memory (ROM), a power down delay module 405 for delaying a host computing system power down by a predefined period of time, and various input/output devices 406, e.g., storage devices, including but not limited to, a tape drive, a floppy drive, a hard disk drive or a compact disk drive, a receiver, a transmitter, a speaker, a display, a speech synthesizer, an output port, an input port and a user input device, such as a keyboard, a keypad, a mouse, a microphone, and the like.

Although one processor element is shown, it should be noted that the computer 400 may employ a plurality of processor elements. Furthermore, although one computer 400 is shown in the figure, if the method(s) as discussed above is implemented in a distributed or parallel manner fora particular illustrative example, i.e., the blocks of the above method(s) or the entire method(s) are implemented across multiple or parallel computers 400, then the computer 400 of this figure is intended to represent each of those multiple computers. Furthermore, a hardware processor can be utilized in supporting a virtualized or shared computing environment. The virtualized computing environment may support a virtual machine representing computers, servers, or other computing devices. In such virtualized virtual machines, hardware components such as hardware processors and computer-readable storage devices may be virtualized or logically represented.

It should be noted that the present disclosure can be implemented by machine readable instructions and/or in a combination of machine readable instructions and hardware, e.g., using application specific integrated circuits (ASIC), a programmable logic array (PLA), including a field-programmable gate array (FPGA), or a state machine deployed on a hardware device, a general purpose computer or any other hardware equivalents, e.g., computer readable instructions pertaining to the method(s) discussed above can be used to configure a hardware processor to perform the blocks, functions and/or operations of the above disclosed methods.

In one example, instructions and data for the present module or process 405 for a delaying power down of a host computing system, e.g., machine readable instructions can be loaded into memory 404 and executed by hardware processor element 402 to implement the blocks, functions or operations as discussed above in connection with the methods 200 and 300. For instance, the module 405 may include a plurality of programming code components, including a signal assertion/de-assertion component 408 and timer component 410.

The signal assertion/de-assertion component 408 may be configured assert and/or de-assert various signals to various components of a SSD or a host computing system, for example as discussed in connection with FIGS. 2 and 3. For instance, the signal assertion/de-assertion component 408 may assert and/or de-assert different signals relating to power down of the host computing system.

The timer component 410 may initiate and monitor a timer that is configured to count down a predefined period of time between assertion ad/or de-assertion of certain signals, for example as discussed in connection with FIGS. 2 and 3. For instance, the timer component 410 may initiate and monitor the status of a timer that imposes a delay between assertion of a reset signal and de-assertion of a power on signal.

Furthermore, when a hardware processor executes instructions to perform "operations", this could include the hardware processor performing the operations directly and/or facilitating, directing, or cooperating with another hardware device or component, e,g,, a co-processor and the like, to perform the operations.

The processor executing the machine readable instructions relating to the above described method(s) can be perceived as a programmed processor or a specialized processor. As such, the present module 405 for a delaying power down of a host computing system, including associated data structures, of the present disclosure can be stored on a tangible or physical (broadly non-transitory) computer-readable storage device or medium, e.g., volatile memory, non-volatile memory, ROM memory, RAM memory, magnetic or optical drive, device or diskette and the like. More specifically, the computer-readable storage device may comprise any physical devices that provide the ability to store information such as data and/or instructions to be accessed by a processor or a computing device such as a computer or an application server.

It will be appreciated that variants of the above-disclosed and other features and functions, or alternatives thereof, may be combined into many other different systems or applications. Various presently unforeseen or unanticipated alternatives, modifications, or variations therein may be subsequently made which are also intended to be encompassed by the following claims.

What is claimed is:

1. A method, comprising:
   detecting, by a controller of a host computing system that includes a solid state drive, an unclean shutdown that initiates a power down of the host computing system;
   in response to the detecting, asserting by the controller a first signal that signals the solid state drive to write data in a volatile memory of the solid state drive to a non-volatile memory of the solid state drive;
   initiating, by the controller, a timer to count down a predefined delay period after the asserting; and
   upon an expiration of the timer, asserting, by the controller, a second signal that instructs a power supply of the host computing system to power off,
   wherein the asserting of the first signal and the asserting of the second signal are performed indirectly by the controller, by sending a system management interrupt command to a basic input/output system of the host computing system.

2. The method of claim 1, wherein the unclean shutdown is caused by an input to a power button of the host computing system.

3. The method of claim 2, wherein the detecting comprises:
   monitoring, by the controller, a length of time for which the power button has been held; and
   determining, by the controller, when the length of time at least meets a threshold period of time that initiates power down of the host computing system.

4. The method of claim 2, wherein the detecting comprises:
   monitoring, by the controller, a length of time for which the power button has been held; and
   determining, by the controller, when the length of time at least meets a threshold period of time that is less than a period of time that initiates power down of the host computing system.

5. The method of claim 1, wherein the detecting comprises:
   monitoring, by the controller, a power state transition of the controller.

6. The method of claim 1, wherein the predefined delay period comprises a predefined but configurable period of time.

7. The method of claim 1, wherein the detecting comprises:

detecting a lack of feedback from the basic input/output system of the host computing system, where a presence of the feedback indicates a dean shutdown.

8. A non-transitory machine-readable storage medium encoded with instructions executable by a controller of a host computing system that includes a solid state drive, the machine-readable storage medium comprising:
   instructions to detect a lack of feedback from a basic input/output system of the host computing device which indicates an unclean shutdown initiating a power down of the host computing system;
   instructions to assert, in response to detecting the power button input, a first signal that signals the solid state drive to write data in a volatile memory of the solid state drive to a non-volatile memory of the solid state drive;
   instructions to initiate a timer to count down a predefined delay period after the asserting; and
   instructions to assert, upon an expiration of the timer, a second signal that instructs a power supply of the host computing system to power off.

9. The non-transitory machine-readable storage medium of claim 8, wherein the unclean shutdown is caused by an input to a power button of the host computing system.

10. The non-transitory machine-readable storage medium of claim 9, wherein the instructions to detect further comprise:
   instructions to monitor a length of time for which the power button has been held; and
   instructions to determine when the length of time at least meets a threshold period of time that initiates power down of the host computing system.

11. The non-transitory machine-readable storage medium of claim 9, wherein the instructions to detect further comprise:
   instructions to monitor a length of time for which the power button has been held; and
   instructions to determine when the length of time at least meets a threshold period of time that is less than a period of time that initiates power down of the host computing system.

12. The non-transitory machine-readable storage medium of claim 8, wherein the predefined delay period comprises a predefined but configurable period of time.

13. An apparatus, comprising:
   a controller to detect an unclean shutdown that initiates a power down of a host computing system, to assert a first signal that signals a solid state drive of the host computing system to write data in a volatile memory of the solid state drive to a non-volatile memory of the solid state drive, to initiate a timer to count down a predefined delay period after an assertion of the first signal, and to assert, upon an expiration of the timer, a second signal that instructs a power supply of the host computing system to power off; and
   a control bus to convey the first signal from the controller to the solid state drive.

14. The apparatus of claim 13, wherein the controller is a super input/output controller.

* * * * *